United States Patent [19]

Kozono

[11] Patent Number: 5,532,514

[45] Date of Patent: Jul. 2, 1996

[54] HIGH FREQUENCY SEMICONDUCTOR DEVICE

[75] Inventor: Hiroyuki Kozono, Omiya, Japan

[73] Assignee: Kabushiki Kaisha Toshiba, Kawasaki, Japan

[21] Appl. No.: 443,449

[22] Filed: May 18, 1995

[30] Foreign Application Priority Data

May 19, 1994 [JP] Japan .................................. 6-129641

[51] Int. Cl.$^6$ ......................... H01L 23/053; H01L 23/34; H01L 23/12; H01P 1/00
[52] U.S. Cl. ......................... 257/728; 257/701; 257/703; 257/704; 333/247
[58] Field of Search .................................. 257/690, 691, 257/692, 698, 701, 703, 704, 705, 710, 734, 784, 728, 678; 333/246, 247

[56] References Cited

U.S. PATENT DOCUMENTS 5,397,918 3/1995 Yokochi et al. ..................... 257/703

FOREIGN PATENT DOCUMENTS 62-249457 10/1987 Japan ..................... 257/710

Primary Examiner—Sara W. Crane
Assistant Examiner—Carl Whitehead, Jr.
Attorney, Agent, or Firm—Finnegan, Henderson, Farabow, Garrett & Dunner

[57] ABSTRACT

The semiconductor device of the present invention includes a semiconductor substrate on which an integrated circuit equipped with a connection electrode is formed on its main surface. At the center of the main surface, a substrate mounting portion having a cavity portion in which the semiconductor substrate is contained, is provided. At the periphery of the main surface of the substrate mounting portion, a plurality of leads are arranged and fixed to the periphery of the semiconductor substrate mounted in the cavity portion so that ends of the leads oppose each other. The plurality of leads include leads selected as power source lines. The connection electrode of the main surface of the semiconductor substrate is electrically connected to one of the ends of the leads via a bonding wire. A cap for covering at least the semiconductor substrate, the bonding wire and the ends of the leads is adhered to the substrate mounting portion.

4 Claims, 6 Drawing Sheets

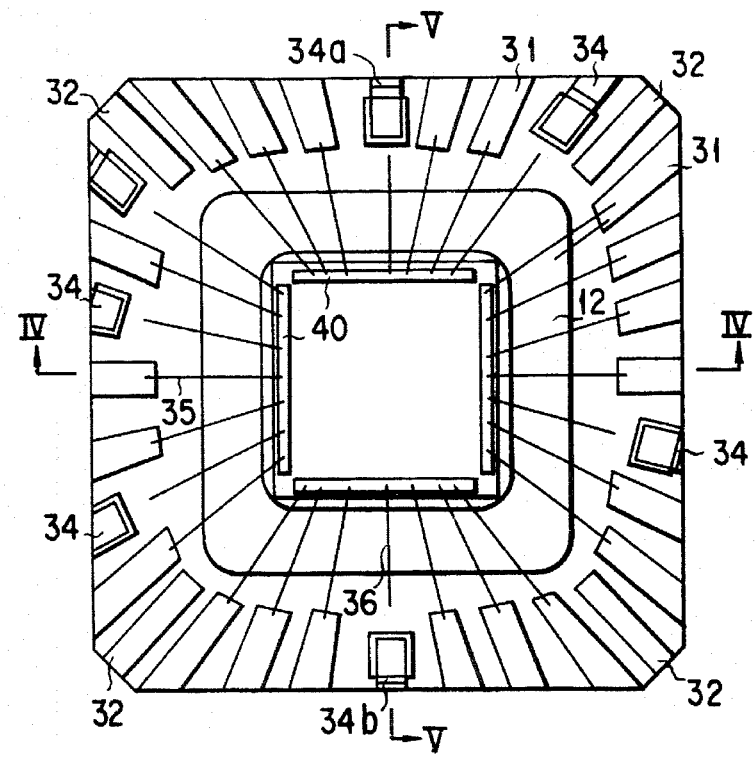
F I G. 3
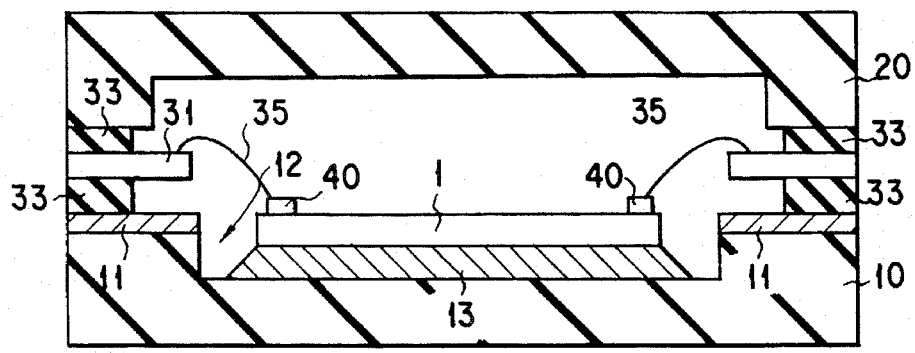
F I G. 4
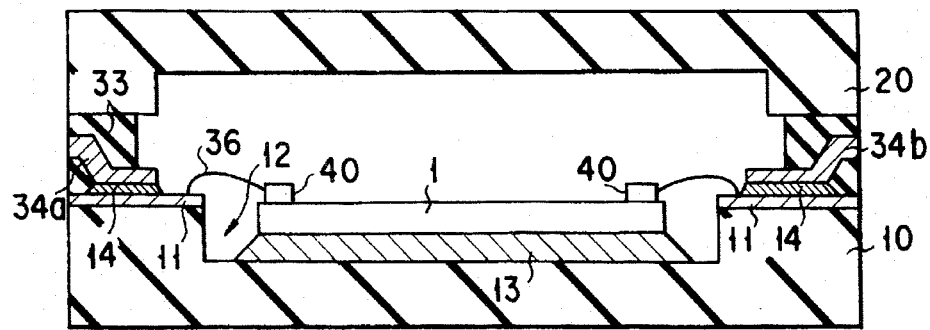
F I G. 5

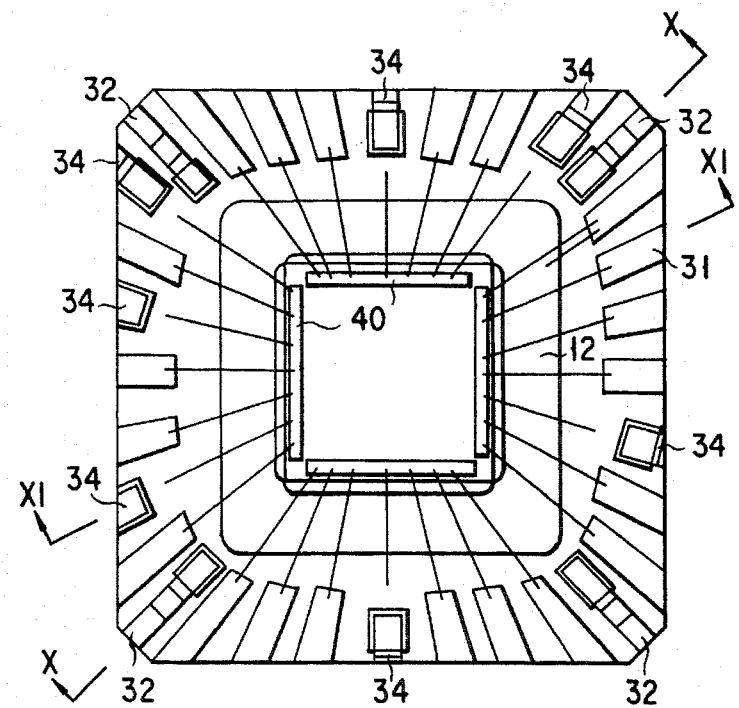
F I G. 9
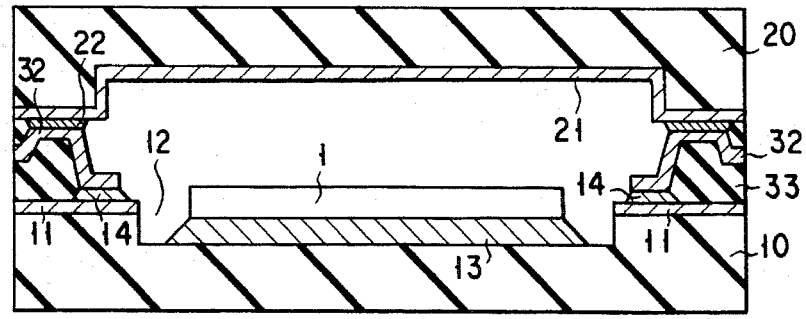
F I G. 10
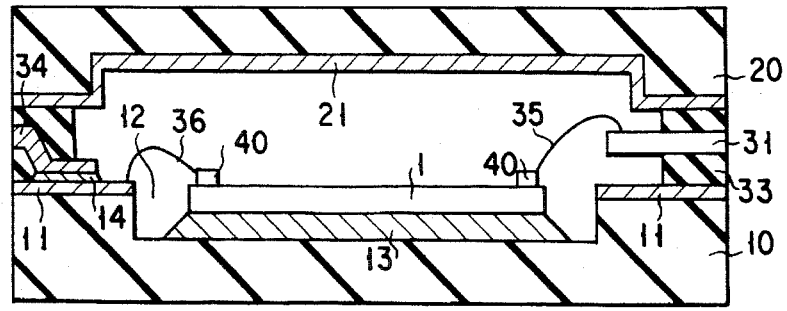
F I G. 11

HIGH FREQUENCY SEMICONDUCTOR DEVICE

BACKGROUND OF THE INVENTION

1. Field of the Invention

The present invention relates to a semiconductor device used for, for example, a frequency of 300 MHz to 1 GHz, which can be easily manufactured and has a high-frequency characteristics.

2. Description of the Related Art

A semiconductor device on which an integrated circuit such as IC or LSI is formed is contained in a package of ceramics or the like. FIG. 1 is a plan view showing a conventional semiconductor device, and FIG. 2 is a cross sectional view taken along the line II to II.

A semiconductor substrate 1 of, for example, a silicon semiconductor, is bonded to a cavity portion 9 at a central portion of a substrate mounting portion 2 consisting of a ceramic substrate of, for example, aluminum nitride, via a conductive adhesive 7.

For example, a lead 3 made from a lead frame of an Fe alloy containing Ni by 42 wt %, is bonded to a periphery portion of the substrate mounting portion 2 by an insulation sealing member 4 made of, for example, glass. A plurality of leads 3 are arranged around the semiconductor substrate 1 with intervals between adjacent leads.

At end portion (inner lead) of each of the leads 3 is connected to a connection electrode 40 on a surface of the semiconductor substrate 1 via a bonding wire 5 of Au, Al or the like. The leads 3 are used as various types of power source wires and signal lines.

Among the grounded ones of the leads 3, leads a arranged at corner portions of the semiconductor substrate 1 towards the central portion thereof, usually serve as supports for a lead frame, and are not used as leads, but in a floating state even after completion of the semiconductor device. For this reason, generally, no lead wires are provided for the corner portions.

The substrate mounting portion 2 is bonded to a cap 6 with the same material as the sealing member 4 used for bonding the lead 3. The cap 6 has a recess portion, and the main surface thereof, which is bonded to the substrate mounting portion 2. In the recess portion, the semiconductor substrate 1, the inner lead portions of the leads 3 and the bonding wires 5 are contained, and they are sealed therein. The cap member is made of ceramics made of the same material as that of the substrate mounting portion, such as aluminum nitride. Further, the semiconductor substrate 1 mounted in the cavity portion 9 at the central portion of the substrate mounting portion 2 is bonded to the substrate mounting portion 2 with the conductive adhesive 7.

Recently, semiconductor devices are, in many cases, used at high frequency. Under such circumstances, in the conventional semiconductor device, leads made from a lead frame are used as power source wires, thus causing a large inductance and increasing noise. Furthermore, only the leads are used as transmitting paths for the integrated circuits formed on the semiconductor substrate. Therefore, when such a semiconductor substrate is used for a frequency band of 300 MHz or higher, it is required to ground (GND) at least one of every four leads so as to prevent the resonance. Therefore, in this case, 1.25 times more leads than it is usually needed are required. Furthermore, for a frequency of 500 MHz or higher, the matching of characteristic impedance must be taken in consideration of transmission characteristics. Therefore, at least one of every two lead must be grounded, thus requiring twice as many leads as it is usually needed.

Moreover, several signal lines are provided between power lines, especially, leads which serve as GNDs; however the distance between a GND and a signal line varies from one case to another, and the arrangement of these lines is asymmetrical. Therefore, when the frequency exceeds 300 MHz, the lines are resonated with each other, making it impossible to achieve the matching of impedance.

SUMMARY OF THE INVENTION

The present invention has been achieved in consideration of the above-described circumstances, and an object thereof is to provide a semiconductor device with a semiconductor device with a power source line in which characteristic impedances are matched without changing the structure of the conventional semiconductor device capable of operating in a high frequency band. Another object thereof is to provide a semiconductor device of a simple structure in which a potential is taken from the rear surface of the semiconductor substrate on which an integrated circuit, along with a shield effect.

In order to achieve the above object, there is provided, according to the present invention, a semiconductor device comprising:

a semiconductor substrate having a main surface on which an integrated circuit equipped with a connection electrode, is formed;

a substrate mounting portion having a cavity portion in which the semiconductor substrate is contained, at a center of the main surface;

a first conductive metal layer formed on a section of the main surface of the substrate mounting portion, other than that for the cavity portion;

a plurality of leads arranged in a periphery of the semiconductor substrate in which the cavity portion is placed, in the first conductive metal layer formed in a periphery portion of the main surface of the substrate mounting portion, so that ends of the plurality of leads oppose to each other, some of the plurality of leads being selected as a power source line;

bonding wires for electrically connecting one of the ends of each of the plurality of leads, to the connection electrode on the main surface of the semiconductor substrate; and cap means for covering at least the semiconductor substrate, the bonding wires and the ends of the plurality of leads.

With the above structure, in the semiconductor device of the present invention, the power source system is made of a metal layer, and therefore the inductance can be reduced, and the noise can be decreased. Further, the power source system and the signal system are made in different layers, the distance between the metal layer and the signal leads is maintained by an arbitrary distance by bending the lead frame which is the material of the leads, in the press step, and they are symmetrically arranged, making it possible to easily use the device in a frequency band of 300 MHz to 1 GHz. Also, the impedance matching can be easily made.

Consequently, the frequency used for each lead is not limited, and therefore the degree of freedom in designing is low, and the frequency used in the package is not dispersed. Further, it is possible to achieve a structure in which the power source system is divided into two layers by a simple step, and therefore the rear surface of the semiconductor substrate can be used as an electrode, and the shield effect can be achieved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a plan view showing a semiconductor device according to the first embodiment of the present invention;

FIG. 4 is a cross sectional view taken along the line IV—IV shown in FIG. 3;

FIG. 5 is a cross sectional view taken along the line V—V shown in FIG. 3;

FIG. 9 is a plan view showing a semiconductor device according to the third embodiment of the present invention;

FIG. 10 is a cross sectional view taken along the line X—X shown in FIG. 9;

FIG. 11 is a cross sectional view taken along the line XI—XI shown in FIG. 9;

DETAILED DESCRIPTION OF THE PREFERRED EMBODIMENTS

Figure 1:
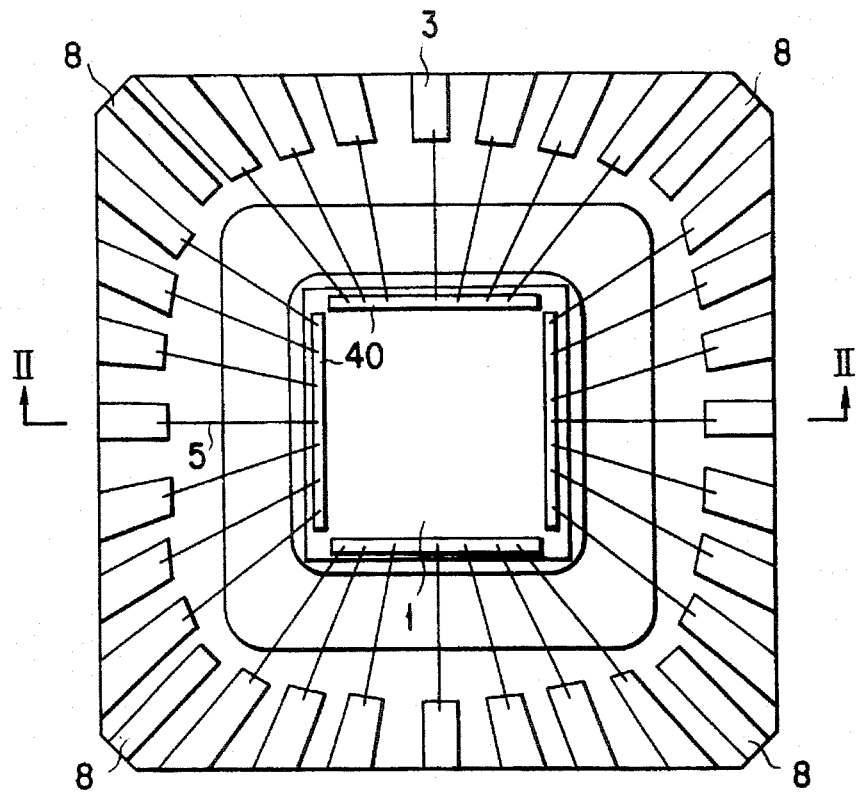
FIG. 1 is a plane view briefly showing the structure of a conventional semiconductor device.
Figure 2:
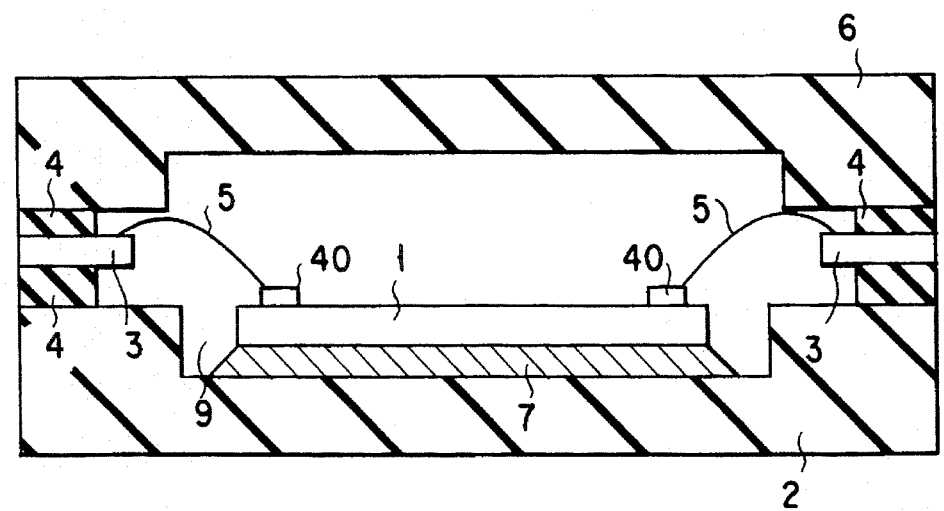
FIG. 2 is a cross sectional view taken along the line II—II shown in FIG. 1.

Embodiments of the present invention will now be described with reference to accompanying drawings.

The first embodiment will now be described with reference to FIGS. 3 to 5.

FIG. 3 is a plan view showing a packaged semiconductor device, and the drawing of a cap (ceramic cap) and a sealing member will be omitted to illustrate the inside of the device.

FIG. 4 is a cross sectional view taken along the line IV—IV in FIG. 3, and FIG. 5 is a cross sectional view taken along the line V—V in FIG. 3.

A substrate mounting portion 10 consists of a ceramic substrate made of aluminum nitride or alumina. In this embodiment, the substrate mounting portion 10 is square-shaped; however the shape of the portion is arbitrary in the present invention, and it may be polygonal such as pentagonal or hexagonal, or even may be circular in an extreme sense.

In the central portion of the main surface of the substrate mounting portion 10, in which a semiconductor substrate 1 is placed, a cavity portion 12 is formed. The semiconductor substrate 1 is fixed in the cavity portion 12 with a conductive adhesive 13 such as solder. In the peripheral portion of the main surface of the substrate mounting portion 10, a conductive metal layer 11 is deposited by vacuum deposition or sputtering; however it is not formed in the cavity portion 12 in the embodiment shown in FIGS. 3 and 4.

A W/Ni/Au film is used as the conductive metal layer 11.

Besides the deposited film, a Mo film, Pd film or the like can be used as the material for the conductive metal layer 11 used in the present invention. Furthermore, in the periphery portion of the substrate mounting portion 10, a plurality of each of leads 31, 32 and 34 are arranged on each side, and they are fixed with a sealing member 33 such as glass.

The end of each lead is directed towards the center of the semiconductor substrate 1. The end of each lead 31 and a connection electrode 40 on the surface of the semiconductor substrate 1 are connected to each other via a bonding wire 35 made of Au, Al or Cu.

The lead 32 arranged towards the center portion of the mounting portion 10 at the corner portions thereof, serve as supporting portion for a lead frame, and are not used as leads, but in a floating state when the semiconductor device is completed. The substrate mounting portion 10 is bonded to a cap 20 with use of the sealing member 33 used to bond the leads 31, 32 and 34.

The cap 20 has a recess, and the main surface thereof is bonded to the substrate mounting portion 10. In the recess of the cap 20, the semiconductor substrate 1, the inner lead portions of the leads 31, the bonding wires 35 and the like are contained, and they are sealed therein. The material of the cap is ceramics which is the same as that of the substrate mounting portion 10, such as aluminum nitride.

As shown in FIG. 5, the leads 34 of the lead column are used as power lines.

In this case, each lead is electrically connected to the connection electrode on the semiconductor substrate 1 not via a bonding wire as in the conventional technique, but the end of each lead is bent, and directly connected via a conductive adhesive 14 to the conductive metal layer 11 grounded and formed at the periphery of the main surface of the substrate mounting portion 10.

As described above, the conductive metal layer 11 is used as a power source layer, and therefore the inductance of the power system is reduced, and especially, the frequency used as a whole package is not dispersed by making the distance to grounds with respect to all the signal lines substantially the same, thus making it possible to match the impedances.

Further, the conductive metal layer 11 used as a power source layer occupies a wide area in the layer, the connection with the leads 34 of the lead column can be easily set at an arbitrary position as a connection portion of the power source layer.

Regarding the power source line 34a shown in FIG. 5, the distance with respect to the semiconductor substrate 1 is made longer than the other leads 31, and therefore the length of the lead thereof is shortened. Conversely, if necessary, the length of the lead may be increased. The power source line 34b illustrated on the right-hand side of the figure is made substantially the same length as that of the other leads 31, and therefore the distance between the semiconductor substrate 1 and the end of the power source line is substantially the same as that between the end of each lead 31 and the semiconductor substrate 1.

As described above, the degree of freedom in the arrangement of the power source line is increased. The conductive metal layer 11 is electrically connected to the connection electrode 40 of the main surface of the semiconductor substrate 1 via a bonding wire 36 made of, for example, Al.

Next, the sealing member 33 such as glass is applied on the lead mounting portion in the periphery region of the substrate mounting portion 10, and a lead frame is placed on the sealing member. Each lead 34 of the lead frame is directly connected to the conductive metal layer 11 via solder or the like, and therefore the end portion of each lead is bent in advance.

In order to simplify the production process, the lead should be bent in advance when the lead frame is formed from a metal plate in the press step. Further, another sealing member 33 is applied again, and a cap is placed on that sealing member. Then, packaging is carried out by applying heat and pressure.

The second embodiment will now be described with reference to FIGS. 6 to 8.

Figure 6:
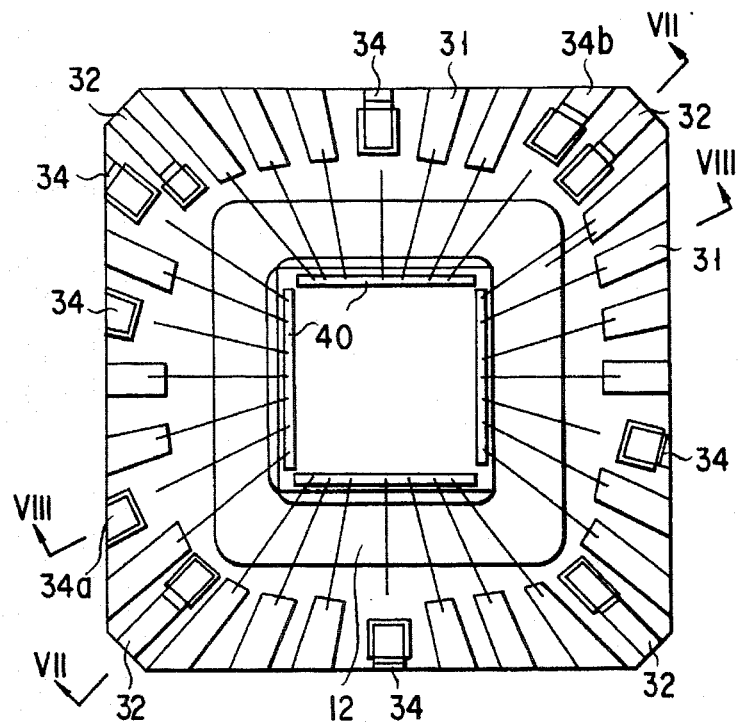
FIG. 6 is a plan view showing a semiconductor device according to the second embodiment of the present invention.

FIG. 6 is a plan view of a semiconductor device which is packaged, and the drawings of the cap and seal material will be omitted so as to better illustrate the inside of the device.

Figure 7:
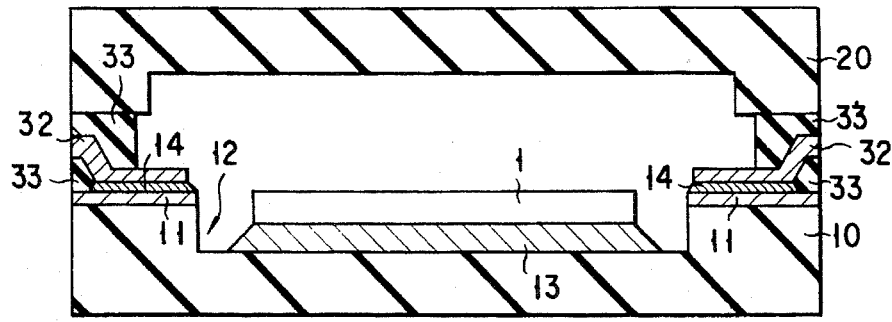
FIG. 7 is a cross sectional view taken along the line VII—VII shown in FIG. 6.
Figure 8:
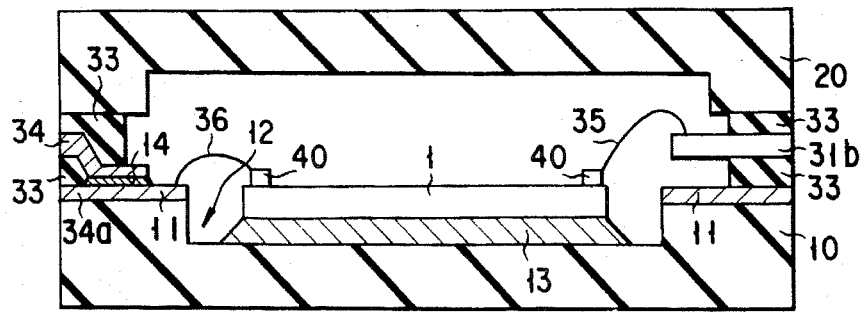
FIG. 8 is a cross sectional view taken along the line VIII—VIII shown in FIG. 6.

FIG. 7 is a cross sectional view taken along the line VII—VII shown in FIG. 6, and FIG. 8 is a cross sectional view taken along the line VIII—VIII shown in FIG. 6. A substrate mounting portion 10 is made of a square-shaped ceramic substrate made of, for example, aluminum nitride.

In the central portion of the main surface of the substrate mounting portion 10, in which a semiconductor substrate 1 is placed, a cavity portion 12 is formed.

The semiconductor substrate 1 is fixed in the cavity portion 12 with a conductive adhesive 13. In the peripheral portion of the main surface of the substrate mounting portion 10, a conductive metal layer 11 is deposited by vacuum deposition or the like; however it is not formed in the cavity portion 12. A W/Ni/Au film is used as the conductive metal layer 11.

Furthermore, in the periphery portion of the substrate mounting portion 10, a plurality of each of leads 31, 32 and 34 are arranged on each side, and they are fixed with a sealing member 33 such as glass. The ends of the leads are directed towards the center of the semiconductor substrate 1. The end of each lead 31 and a connection electrode 40 on the surface of the semiconductor substrate 1 are connected to each other via a bonding wire 35 made of Au, Al or Cu.

The leads 34 of the lead column are used as power source lines. In this case, each lead is electrically connected to the connection electrode on the semiconductor substrate 1 not via a bonding wire as in the conventional technique, but the end of each lead is bent, and directly connected via a conductive adhesive 14 to the conductive metal layer 11 grounded and formed at the periphery of the main surface of the substrate mounting portion 10.

The conductive metal layer 11 is electrically connected to the connection electrode 40 of the main surface of the semiconductor substrate 1 via a bonding wire 36 made of, for example, Al.

The leads 32 such as shown in FIG. 6 and arranged towards the center portion of the mounting portion 10 at the corner portions thereof, serve as a supporting portions for the lead frame and conventionally in a floating state. However, in this embodiment, as shown in FIG. 7, the end of each lead 32 is adhered to the conductive metal layer 11 with a conductive adhesive 14, and each lead is utilized as a power source line.

The substrate mounting portion 10 is bonded to a cap 20 with use of the sealing member 33 used to bond the leads 31, 32 and 34. The cap 20 has a recess, and the main surface thereof is bonded to the substrate mounting portion 10. In the recess of the cap 20, the semiconductor substrate 1, the inner lead portions of the leads 31, 32 and 34, the bonding wires 35 and 36, and the like are contained, and they are sealed therein.

The material of the cap is ceramics which is the same as that of the substrate mounting portion 10, such as aluminum nitride.

As described above, the conductive metal layer 11 is used as a power source layer, and therefore the inductance of the power system is reduced, and especially, the frequency used as a whole package is not dispersed by making the distances to grounds with respect to all the signal lines substantially the same, thus making it possible to match the impedances.

The third embodiment will now be described with reference to FIGS. 9 to 11.

FIG. 9 is a plan view of a semiconductor device which is packaged, and the drawings of the cap and seal material will be omitted so as to better illustrate the inside of the device.

FIG. 10 is a cross sectional view taken along the line X—X shown in FIG. 9, and FIG. 11 is a cross sectional view taken along the line XI—XI shown in FIG. 9. A substrate mounting portion 10 is made of a square-shaped ceramic substrate made of, for example, aluminum nitride.

In the central portion of the main surface of the substrate mounting portion 10, in which a semiconductor substrate 1 is placed, a cavity portion 12 is formed. The semiconductor substrate 1 is fixed in the cavity portion 12 with a conductive adhesive 13. In the peripheral portion of the main surface of the substrate mounting portion 10, a first conductive metal layer 11 is deposited by vacuum deposition or the like; however it is not formed in the cavity portion 12. A W/Ni/Au film is used as the first conductive metal layer 11.

In the periphery portion of the substrate mounting portion 10, a plurality of each of leads 31, 32 and 34 are arranged on each side, and they are fixed with a sealing member 33 such as of glass. The ends of the leads are directed towards the center of the semiconductor substrate 1. The end of each lead 31 and a connection electrode 40 on the surface of the semiconductor substrate 1 are connected to each other via a bonding wire 35.

As shown in FIG. 11, the leads 34 are used as power source lines. The end of each lead is bent, and each lead is directly connected to the first conductive metal layer 11 which is formed in the periphery portion of the main surface of the substrate mounting portion 10 and is grounded, with a conductive adhesive 14 such as solder.

The first conductive metal layer 11 is electrically connected to a connection electrode 40 on the semiconductor substrate 1 with a bonding wire 36. The substrate mounting portion 10 is bonded to a cap 20 with use of the sealing member 33 used to bond the leads 31, 32 and 34.

The cap 20 has a recess, and the main surface thereof is bonded to the substrate mounting portion 10. In the recess of the cap 20, the semiconductor substrate 1, the inner lead portions of the leads 31, 32 and 34, the bonding wires 35 and 36, and the like are contained, and they are sealed therein. This embodiment is characterized in that a second conductive metal layer 21 is formed on the inner surface of the cap 20.

The leads 32 arranged towards the center portion of the mounting portion 10 at the corner portions thereof, serve as a supporting portion for the lead frame and conventionally in a floating state. However, in this embodiment, as shown in FIG. 10, each lead 32 is bent to the cap side once and then folded back to the substrate mounting portion side. Then, the folded portion is connected to the second conductive metal layer 21 with a conductive adhesive 22 such as solder, and the end of the lead 32 is bonded to the first conductive metal layer 11 with the conductive adhesive 14. Thus, each lead 32 is utilized as a power source line.

When this lead 32, the first and second conductive metal layers 11 and 21 are electrically connected to each other. The conductive metal layer 21 deposited on the cap 20 does not have to be formed on the entire surface thereof, but may be formed only on the sections in which the leads are formed.

As described above, the conductive metal layer 11 is used as a power source layer, and therefore the inductance of the power system is reduced, and especially, the frequency used as a whole package is not dispersed by making the power system, especially the distances to grounds with respect to all the signal lines substantially the same, thus making it possible to match the impedances. Further, with the second conductive metal layer 21 provided for the cap 20, the leads which constitute the signals are interposed between the power source layers made by the first and second conductive metal layers 11 and 21, thus improving the frequency characteristics.

The fourth embodiment will now be described with reference to FIGS. 12 to 14.

Figure 12:
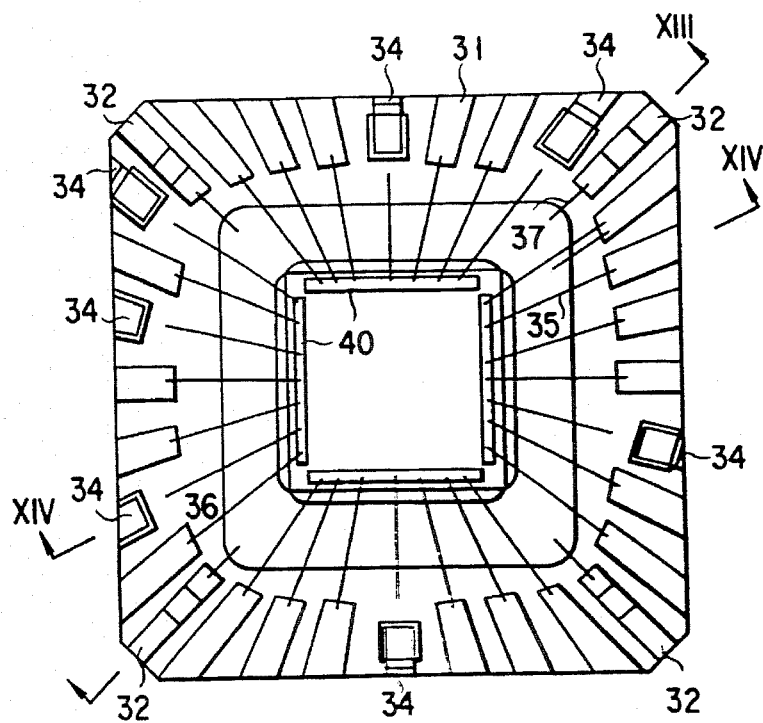
FIG. 12 is a plan view showing a semiconductor device according to the fourth embodiment of the present invention.

FIG. 12 is a plan view of a semiconductor device which is packaged, and the drawings of the cap and seal material will be omitted so as to better illustrate the inside of the device.

Figure 13:
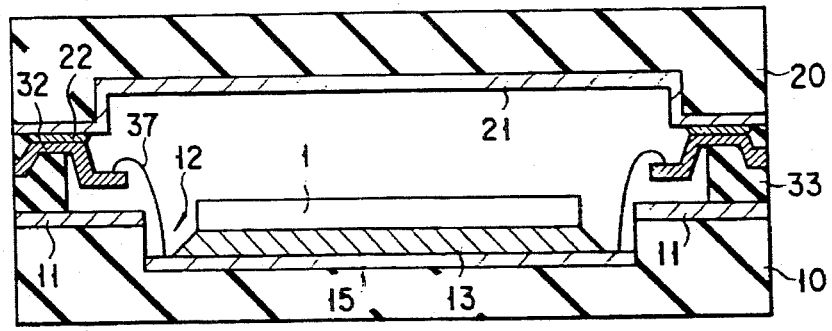
FIG. 13 is a cross sectional view taken along the line VIII—VIII shown in FIG. 12.
Figure 14:
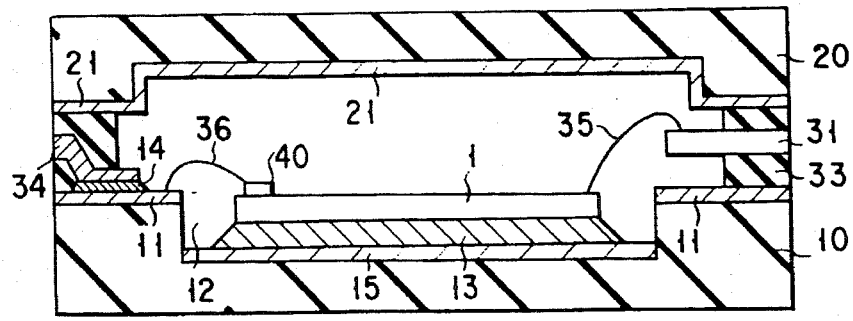
FIG. 14 is a cross sectional view taken along the line XIV—XIV shown in FIG. 12.

FIG. 13 is a cross sectional view taken along the line XIII—XIII shown in FIG. 12, and FIG. 14 is a cross sectional view taken along the line XIV—XIV shown in FIG. 12. As shown in FIGS. 13 and 14, a substrate mounting portion 10 is made of a square-shaped ceramic substrate made of, for example, aluminum nitride. In the central portion of the main surface of the substrate mounting portion 10, in which a semiconductor substrate 1 is placed, a cavity portion 12 is formed. The semiconductor substrate 1 is fixed in the cavity portion 12 with a conductive adhesive 13.

In the peripheral portion of the main surface of the substrate mounting portion 10, a first conductive metal layer 11 is deposited by vacuum deposition or the like, and a third conductive metal layer 15 is formed on the bottom surface of the cavity portion 12. Therefore, the semiconductor 1 is mounted on the third conductive metal layer 15, and the rear surface of the semiconductor substrate 1 is used as the electrode. For example, a W/Ni/Au film is used as the first and third conductive metal layers 11 and 15. In the periphery portion of the substrate mounting portion 10, a plurality of each of leads 31, 32 and 34 are arranged on each side, and they are fixed with a sealing member 33 such as of glass.

The ends of the leads are directed towards the center of the semiconductor substrate 1. The end of each lead 31 and a connection electrode 40 on the surface of the semiconductor substrate 1 are connected to each other via a bonding wire 35. As shown in FIG. 13, the leads 34 are used as power source lines. The end of each lead 34 is bent, and is directly connected to the first conductive metal layer 11 which is formed in the periphery portion of the main surface of the substrate mounting portion 10 and is grounded, with a conductive adhesive 14 such as solder. The first conductive metal layer 11 is electrically connected to a connection electrode on the main surface of the semiconductor substrate 1 with a bonding wire 36. The substrate mounting portion 10 is bonded to a cap 20 with use of the sealing member 33 used to bond the leads 31, 32 and 34.

The cap 20 has a recess, and the main surface thereof is bonded to the substrate mounting portion 10 is formed. In the recess of the cap 20, the semiconductor substrate 1, the inner lead portions of the leads 31, 32 and 34, the bonding wires 35 and 36, and the like are contained, and they are sealed therein. This embodiment is characterized in that a second conductive metal layer 21 is formed on the inner surface of the cap 20, and the third conductive metal layer 15 is formed in the cavity portion 12 of the substrate mounting section 10.

The conductive metal layer 21 deposited on the cap 20 does not have to be formed on the entire surface thereof, but may be formed only on the sections in which the leads are formed.

Further, with regard to the leads 32 arranged towards the center portion of the mounting portion 10 at the corner portions thereof, each lead 32 is, as shown in FIG. 12, bent to the cap side once and then folded back to the substrate mounting portion side, and is connected to the second conductive metal layer 21 with a conductive adhesive 22 such as solder. The end of each lead 32 is connected to the third conductive metal layer 15 on the bottom portion of the cavity portion 12 with a bonding wire 37. Thus, each lead 32 is utilized as a power source line. With this lead 32, the second and third conductive metal layers 21 and 15 are electrically connected to each other.

As described above, these conductive metal layers are used as power source layers, and therefore the inductance of the power system is reduced, and especially, the frequency used as a whole package is not dispersed by making the power system, especially the distances to grounds with respect to all the signal lines substantially the same, thus making it possible to match the impedances. Further, with the second conductive metal layer 21 provided for the cap 20, the leads which constitute the signals lines are interposed between the power source layers made by the first and second conductive metal layers 11 and 21, thus improving the frequency characteristics.

The fifth embodiment will now be described with reference to FIGS. 15 to 17.

Figure 15:
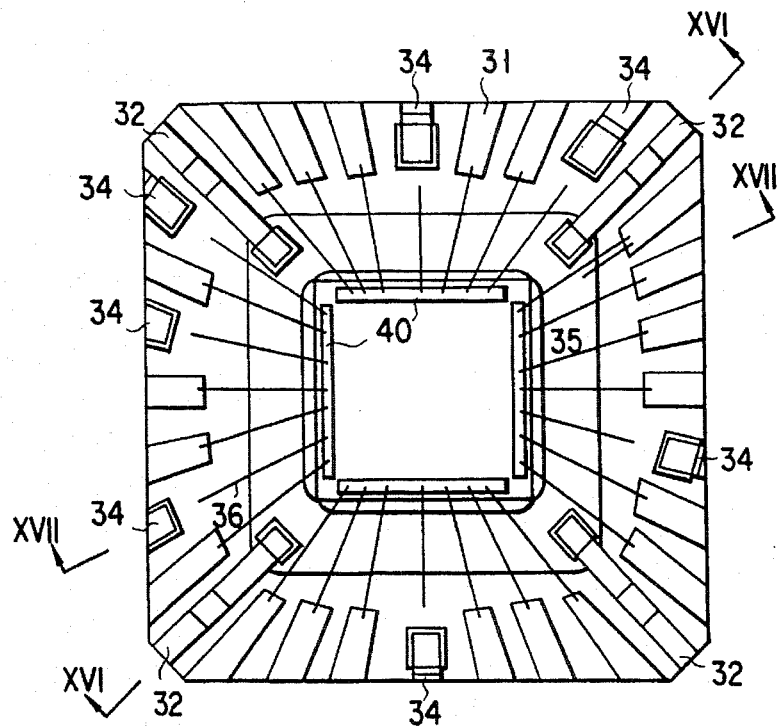
FIG. 15 is a plan view showing a semiconductor device according to the fifth embodiment of the present invention.

FIG. 15 is a plan view of a semiconductor device which is packaged, and the drawings of the cap and seal material will be omitted so as to better illustrate the inside of the device.

Figure 16:
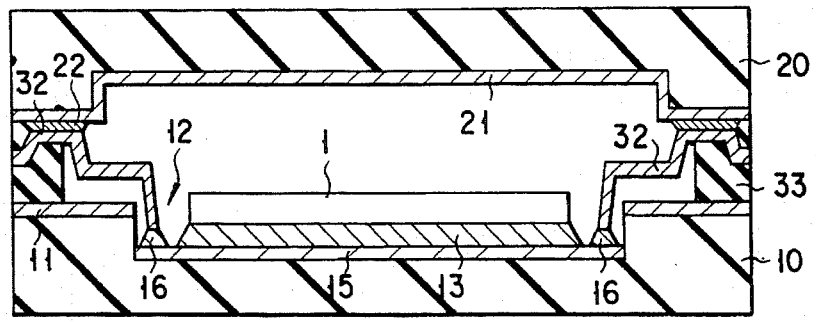
FIG. 16 is a cross sectional view taken along the line XVI—XVI shown in FIG. 15.
Figure 17:
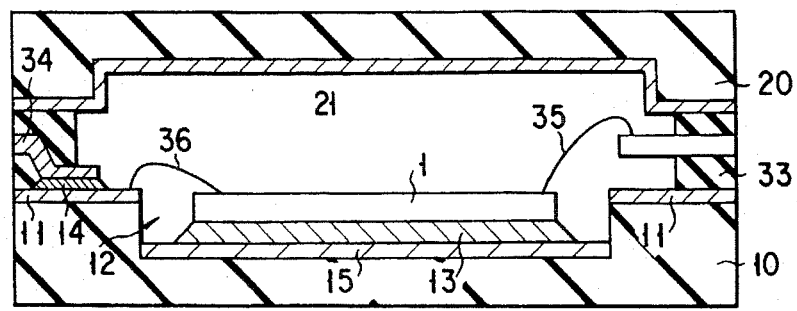
FIG. 17 is a cross sectional view taken along the line XVII—XVII shown in FIG. 15.

FIG. 16 is a cross sectional view taken along the line XVII—XVII shown in FIG. 15, and FIG. 17 is a cross sectional view taken along the line XVI—XVI shown in FIG. 15. A substrate mounting portion 10 is made of a square-shaped ceramic substrate made of, for example, aluminum nitride.

In the central portion of the main surface of the substrate mounting portion 10, in which a semiconductor substrate 1 is placed, a cavity portion 12 is formed. The semiconductor substrate 1 is fixed in the cavity portion 12 with a conductive adhesive 13. In the peripheral portion of the main surface of the substrate mounting portion 10, a first conductive metal layer 11 is deposited by vacuum deposition or the like, and a third conductive metal layer 15 is formed on the bottom surface of the cavity portion 12.

Therefore, the semiconductor 1 is mounted on the third conductive metal layer 15, and the rear surface of the semiconductor substrate 1 is used as the electrode. For example, a W/Ni/Au film is used as the first and third conductive metal layers 11 and 15.

The first to third conductive metals 11, 21 and 15 may be formed of the same material and by the same preparation method. In the periphery portion of the main surface of the substrate mounting portion 10, a plurality of each of leads 31, 32 and 34 are arranged on each side, and they are fixed with a sealing member 33 such as of glass.

The ends of the leads are directed towards the center of the semiconductor substrate 1. The end of each lead 31 and a connection electrode 40 on the surface of the semiconductor substrate 1 are connected to each other via a bonding wire 35, as shown in FIG. 15. The leads 34 are used as power source lines. The end of each lead 34 is bent, and is directly connected to the first conductive metal layer 11 which is formed in the periphery portion of the main surface of the substrate mounting portion 10 and is grounded, with a conductive adhesive 14 such as solder.

The first conductive metal layer 11 is electrically connected to a connection electrode 40 on the main surface of the semiconductor substrate 1 with a bonding wire 36. The substrate mounting portion 10 is bonded to a cap 20 with use of the sealing member 33 used to bond the leads 31, 32 and 34.

The cap 20 has a recess, and the main surface thereof is bonded to the substrate mounting portion 10. In the recess of the cap 20, the semiconductor substrate 1, the inner lead portions of the leads 31, 32 and 34, the bonding wires 35 and 36, and the like are contained, and they are sealed therein. This embodiment is characterized in that the second conductive metal layer 21 is formed on the inner surface of the cap 20, and the third conductive metal layer 15 is formed in the cavity portion 12 of the substrate mounting section 10. The conductive metal layer 21 deposited on the cap 20 does not have to be formed on the entire surface thereof, but may be formed only on the sections in which the leads are formed.

Further, with regard to the leads 32 arranged towards the center portion of the mounting portion 10 at the corner portions thereof, the end of each lead 32 is, as shown in FIG. 16, extended further than the other leads 31 and 34 to be closer to the semiconductor substrate 1. Each lead 32 is bent on the cap side once and then folded back to the substrate mounting portion side, and is connected to the second conductive metal layer 21 with a conductive adhesive 22 such as solder.

The end of each lead 32 is extended to the third conductive metal layer 15 on the bottom portion of the cavity portion 12, and therefore the end is bent to be brought into contact will the third conductive metal layer 15 and adhered thereto with a conductive adhesive 16. Thus, each lead 32 is utilized as a power source line. With this lead 32, the second and third conductive metal layers 21 and 15 are electrically connected to each other.

As described above, these conductive metal layers are used as power source layers, and therefore the inductance of the power system is reduced, and especially, the frequency used as a whole package is not dispersed by making the power system, especially the distances to grounds with respect to all the signal lines substantially the same, thus making it possible to match the impedances. Further, with the second conductive metal layer 21 provided for the cap 20, the leads which constitute the signals lines are interposed between the power source layers made by the first to third conductive metal layers 11, 21 and 15, thus improving the frequency characteristics.

The leads arranged at the corner portions of the substrate mounting portion are protruded further than the other leads towards the cavity portion, and therefore the leads can be connected directly to the third conductive metal layer 15 formed in the bottom portion of the cavity portion. Therefore, a clearance with wire bonding to the cavity portion does not have to be provided. Consequently, the size of the semiconductor device can be reduced.

Another embodiment will now be described with reference to the fifth embodiment.

This embodiment is the same as the embodiment shown in FIGS. 15 and 17 in the structure in the package, and is characterized in that a material having a fluidity before hardening is used to prepare power source layers formed in the cavity portion 12 of the substrate mounting portion 10, without using the third conductive metal layer 15. With use of such a material, the leads 32 can be electrically bonded without using the conductive adhesive 16.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:

a semiconductor substrate having a surface on which a connection electrode is formed;

a polygonal shaped substrate mounting portion having a cavity portion containing said semiconductor substrate such that said semiconductor substrate is located at a central portion of a main surface of said substrate mounting portion;

a first conductive metal layer formed on a portion of said main surface of said substrate mounting portion located outside said cavity portion;

a plurality of leads arranged along a periphery of said cavity portion, said leads being located above the first conductive metal layer so that respective ends of said plurality of leads oppose each other, at least some of said plurality of leads being arranged between corner portions of said substrate mounting portion and said cavity portion and forming power source lines for said semiconductor device;

bonding wires for connecting at least some of the respective ends of said plurality of leads to the connection electrode formed on the surface of said semiconductor substrate; and cap means for covering at least said semiconductor substrate, said bonding wires, and said respective ends of said plurality of leads, said cap means having a main surface opposed to said semiconductor substrate and a second conductive metal layer formed on said main surface so that said second conductive metal layer covers said plurality of leads, said plurality of leads being bonded to said first conductive metal layer and said second conductive metal layer.

2. A semiconductor device comprising:

a semiconductor substrate having a surface on which a connection electrode is formed;

a polygonal shaped substrate mounting portion having a cavity portion containing said semiconductor substrate such that said semiconductor substrate is located at a central portion of a main surface of said substrate mounting portion;

a first conductive metal layer formed on a portion of said main surface of said substrate mounting portion located outside said cavity portion;

a plurality of leads arranged along a periphery of said cavity portion, said leads being located above the first conductive metal layer so that respective ends of said plurality of leads oppose each other, at least some of said plurality of leads being arranged between corner portions of said substrate mounting portion and said cavity portion and forming power source lines for said semiconductor device;

bonding wires for connecting at least some of the respective ends of said plurality of leads to the connection electrode formed on the surface of said semiconductor substrate; and cap means for covering at least said semiconductor substrate, said bonding wires, and said respective ends of said plurality of leads, said cap means having a main surface opposed to said semiconductor substrate and a second conductive metal layer formed on said main surface so that said second conductive metal layer covers said plurality of leads; and a third conductive metal layer formed on a bottom surface of said cavity portion, said some of said plurality of leads arranged between corner portions of said substrate mounting portion and said cavity portion being electrically connected to said second conductive metal layer and said third conductive metal layer.

3. A semiconductor device according to claim 2, wherein said some of said plurality of leads arranged between corner portions of said substrate mounting portion and said cavity portion are electrically connected to said third conductive metal layer via additional bonding wires.

4. A semiconductor according to claim 2, wherein said third conductive metal layer is made of conductive adhesive.

* * * * *